US00RE40507E

(19) United States
(12) Reissued Patent
Kelkar et al.

(10) Patent Number: US RE40,507 E
(45) Date of Reissued Patent: Sep. 16, 2008

(54) METHOD OF FORMING PRE-METAL DIELECTRIC FILM ON A SEMICONDUCTOR SUBSTRATE INCLUDING FIRST LAYER OF UNDOPED OXIDE OF HIGH OZONE:TEOS VOLUME RATIO AND SECOND LAYER OF LOW OZONE DOPED BPSG

(75) Inventors: Amit S. Kelkar, Flower Mound, TX (US); Michael D. Whiteman, Woodland Park, CO (US)

(73) Assignee: Atmel Corporation, San Jose, CA (US)

(21) Appl. No.: 10/606,426

(22) Filed: Jun. 25, 2003

Related U.S. Patent Documents

Reissue of:
(64) Patent No.: 6,489,254
Issued: Dec. 3, 2002
Appl. No.: 09/650,961
Filed: Aug. 29, 2000

(51) Int. Cl.
*H01L 21/31* (2006.01)
*H01L 21/469* (2006.01)

(52) U.S. Cl. ..... 438/778; 438/624; 438/761; 438/763; 438/783; 438/784; 438/787; 257/E21.243; 257/E21.275; 257/E21.279

(58) Field of Classification Search ..... 438/778, 438/624, 761, 763, 783, 784, 787; 427/255.37
See application file for complete search history.

(56) References Cited

U.S. PATENT DOCUMENTS

| | | | | |
|---|---|---|---|---|
| 5,166,101 | A | 11/1992 | Lee et al. | 437/238 |
| 5,271,972 | A | 12/1993 | Kwok et al. | 427/579 |
| 5,314,845 | A | 5/1994 | Lee et al. | 437/238 |
| 5,332,694 | A | 7/1994 | Suzuki | 437/195 |
| 5,354,387 | A | 10/1994 | Lee et al. | 148/33.3 |
| 5,491,108 | A | 2/1996 | Suzuki et al. | 437/192 |
| 5,518,962 | A | 5/1996 | Murao | 437/195 |
| 5,607,880 | A | 3/1997 | Suzuki et al. | 437/195 |
| 5,869,403 | A | 2/1999 | Becker et al. | 438/738 |
| 5,994,237 | A | 11/1999 | Becker et al. | 438/734 |
| 6,013,584 | A | 1/2000 | M'Saad | 438/783 |
| 6,090,675 | A | 7/2000 | Lee et al. | 438/301 |
| 6,091,121 | A | 7/2000 | Oda | 257/408 |
| 6,218,268 | B1 | 4/2001 | Xia et al. | 438/435 |
| 6,294,483 | B1 * | 9/2001 | Wang et al. | 438/783 |
| 6,352,943 | B2 * | 3/2002 | Maeda et al. | 438/778 |

FOREIGN PATENT DOCUMENTS

| | | |
|---|---|---|
| EP | 0435161 A1 | 7/1991 |
| EP | 0939433 A2 | 9/1999 |
| WO | WO99/53729 | 11/1999 |

OTHER PUBLICATIONS

Wolff et al., Silicon Processing for the VLSI Era, vol. 1, Lattice Press, 1986, pp. 182–191.

* cited by examiner

*Primary Examiner*—Alexander Ghyka
(74) *Attorney, Agent, or Firm*—Schwegman, Lundberg & Woessner, P.A.

(57) ABSTRACT

A method of forming a pre-metal dielectric film having good as deposited gapfill characteristics, as well as good mobile-ion gettering capability. The method involves first depositing a layer of high-ozone undoped silicon dioxide film having a high ozone/TEOS volume ratio. Then, a low-ozone doped BPSG film is deposited over the high-ozone undoped silicon dioxide layer. The film layers are heat treated to densify the film, and then the top layer is planarized using known planarization techniques to a thickness that allows for adequate mobile-ion gettering.

17 Claims, 2 Drawing Sheets

METHOD OF FORMING PRE-METAL DIELECTRIC FILM ON A SEMICONDUCTOR SUBSTRATE INCLUDING FIRST LAYER OF UNDOPED OXIDE OF HIGH OZONE:TEOS VOLUME RATIO AND SECOND LAYER OF LOW OZONE DOPED BPSG

Matter enclosed in heavy brackets [ ] appears in the original patent but forms no part of this reissue specification; matter printed in italics indicates the additions made by reissue.

TECHNICAL FIELD

This invention relates to semiconductor processing and, more particularly, to a method of forming a dielectric film on a semiconductor substrate and to a method of forming a semiconductor device having this dielectric film.

BACKGROUND ART

In the formation of semiconductor integrated circuit devices, a frequent practice in the planar process is to form subsurface diffusion layers and polysilicon conductors on a silicon substrate surface. One or more dielectric films are deposited over the silicon substrate surface and metal wiring conductors are formed on or in the dielectric film to interconnect the various components formed on the silicon substrate surface to achieve the desired integrated circuit.

It is desirable that the dielectric films which are deposited on the substrate prior to the metallization process have a good mobile-ion gettering property, as well as a good reflow or gapfill property. A type of insulating film that has been widely used in the prior art is a single layer of borophosphosilicate (BPSG). With reference to FIG. 5, in the prior art, usually a thin undoped liner oxide 58 is first deposited over a silicon substrate surface 52 having a plurality of polysilicon conductors 54. The thin undoped liner oxide 58 is typically formed by reacting silane ($SiH_4$) with oxygen and that layer is then followed by a layer of a doped glass, such as a layer of BPSG 56, as mentioned above. The purpose of the thin undoped liner oxide layer 58 is to prevent the phosphorous or boron contained in the BPSG film 60 from being diffused into the diffusion layer of the substrate 52.

The purpose for using the BPSG film as the interlayer dielectric film is based on a gettering property and on a reflow property. It is important that the dielectric film have good gettering properties as it is desired to be able to getter effectively to remove any impurities that are introduced during the wafer fabrication process. It is also important that the dielectric film have good reflow properties so as to completely fill in the gaps between raised polysilicon conductors on the silicon substrate surface. This quality is sometimes referred to as having good "gapfill" or good "step coverage".

In the prior art, the BPSG film layer is typically formed by reacting tetra-ethyl-ortho-silicate (TEOS) with ozone ($O_3$) in the presence of phosphine ($PH_3$) and diborane ($B_2H_6$). In this document we refer to the ozone and TEOS reactants as "ozone/TEOS" or "ozone and TEOS". The doped BPSG film has about four to six percent weight of boron and about from four to eight percent weight of phosphorus. The softening point of $SiO_2$ can be reduced to about 875-900° C. by the addition of high quantities of boron and phosphorus as described above. Then, a reflow step is used at high temperatures, such as 875-900° C., to soften the doped glass and to flow it into the seams and gaps in the substrate to form a pre-metal dielectric film with good gapfill qualities. However, it is noted that the heavily doped BPSG film does not have good as-deposited gapfill qualities. It only completely fill the gaps between the polysilicon conductors after it has been reflowed at a temperature higher than its softening point.

However, as device geometries continue to decrease in size, reflow at high temperatures is not desirable due to enhanced diffusion of the n- and p-type dopants that are in the silicon substrate. This diffusion can cause undesirable shifts in the electrical parameter of the device, such as shifts in the threshed voltage and the saturation current. Without the high temperature reflow, however, the heavily-doped BPSG film does not adequately fill in the gaps. The doping materials, boron and phosphorous, lower the softening point of the glass so that is doesn't provide an adequate gapfill at lower temperatures. As shown in FIG. 5, voids 60 can develop in the BPSG film 56 between the polysilicon conductors 54. When contacts are etched through the dielectric film and are filled with tungsten during the subsequent metallization process, the tungsten, which is deposited by chemical vapor deposition (CVD), fills into the voids causing residual metal or "stringers" to form between adjacent contacts. This can cause unwanted electrical shorting between the adjacent contacts, which can cause the semiconductor device to fail. Therefore, what is needed is a pre-metallization dielectric film with good gapfill characteristics without the requirement of high temperature reflow..

Previous attempts in the prior art to produce an interlevel dielectric film with good gap fill qualities include U.S. Pat. No. 5,518,962 to Murao which discloses a semiconductor device formed at a substrate surface region which is coated with a non-doped CVD silicon oxide film, and an interlayer insulating film formed on the silicon oxide film and composed of a first ozone-TEOS non-doped silicate glass (NSG) film, a layer of BPSG film, and a second ozone-TEOS NSG film. Additionally, U.S. Pat. Nos. 5,869,403 and 5,994,237 to Becker et al. describe a semiconductor processing method of forming a contact opening to a substrate adjacent to a substrate contact area to which electrical connection is to be made. In the preferred embodiment, a first oxide layer, formed from the decomposition of TEOS, is formed over the substrate to cover at least a part of the contact area, and a second oxide layer made of BPSG is formed over the first oxide layer. Also, U.S. Pat. Nos. 5,166,101 and 5,354,387 to Lee et al. discloses a composite BPSG insulating and planarizing layer which is formed over stepped surfaces of a semiconductor wafer by a two-step process. The two step deposition process comprises a first step to form a void-free BPSG layer by a CVD deposition using gaseous sources of phosphorous and boron dopants and TEOS as the source of silicon, and then a second step to form a capping layer of BPSG.

It is an object of the present invention to provide a method of forming a pre-metal interlevel dielectric film that is characterized by good mobile-ion gettering capability and by good gapfill characteristics.

It is a further object of the invention to provide a method of forming a pre-metal interlevel dielectric film which displays good as-deposited gapfill characteristics which are not dependent on a high temperature reflow process.

SUMMARY OF THE INVENTION

The above objects have been achieved by a method of forming a pre-metal dielectric film having good as-deposited gapfill characteristics, as well as good gettering capability. The method involves first depositing a layer of high-ozone undoped silicon dioxide film that provides the void-free gapfill characteristic and then depositing a low-ozone doped BPSG film that provides the gettering capability. This two layer insulating film provides the ability to have the gaps adequately filled between small or narrow lines without sacrificing good mobile-ion gettering properties. Prior art insulating films tend to provide either good gapfill or good gettering but not both, or the prior art films require several layers to achieve the desired properties.

The undoped silicon dioxide film has a high ozone/TEOS volume ratio of at least 15 to 1, as compared to the prior art doped BPSG film which generally have lower ozone/TEOS ratios, such as 10 to 1. By forming a film with a high ozone/TEOS ratio, the surface mobility of the TEOS-dimer is increased, causing the film to have better flow characteristics. The reactants can diffuse readily on the surface, thus finding the regions having the lowest energy. This results in a void-free dielectric film surface.

A heat treatment is then applied to densify the film, rather than to soften and flow the film as is done in the prior art. This allows the best treatment to be conducted at a lower temperature, which prevents the diffusion problems described above that are associated with high temperature heat treatment in smaller device geometries. Finally, the top of the second BPSG layer is planarized using chemical mechanical planarization. The method of the present invention can be used in the formation of semiconductor devices and can be also used in the formation of other structures requiring a good gapfill or step coverage, such as the formation of polysilicon bus structures.

BEST MODE FOR CARRYING OUT THE INVENTION

Figure 1:
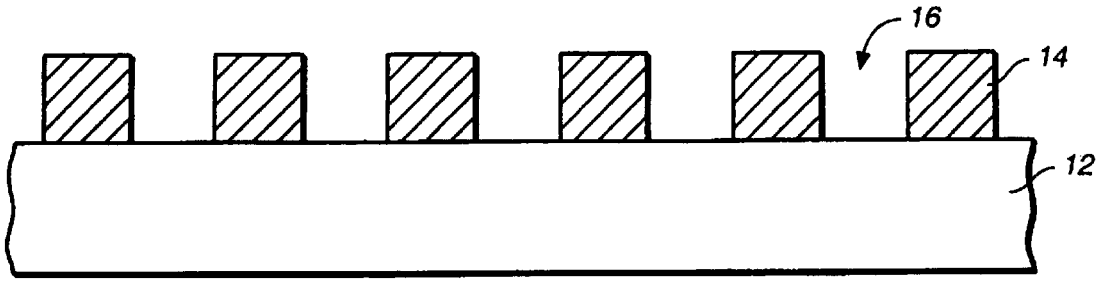
FIG. 1 is a cross-sectional view of a semiconductor substrate having a plurality of polysilicon conductors.

With reference to FIG. 1, a silicon substrate 12 has a plurality of polysilicon conductors 14 formed on a top surface thereof. It is understood that the silicon substrate 12 has undergone the various steps of wafer preparation previous to the method of the present invention in order to form the various diodes, transistors, and resistors and other components on the substrate. This is done by adding dopants to the pure silicon in a manner that is well known in the art. The polysilicon conductors 14 are also formed on the top surface of the substrate in a manner that is known in the art. Between each of the polysilicon conductors 14 are gaps 16 which will need to be filled with electrically isolating dielectric film.

Figure 2:
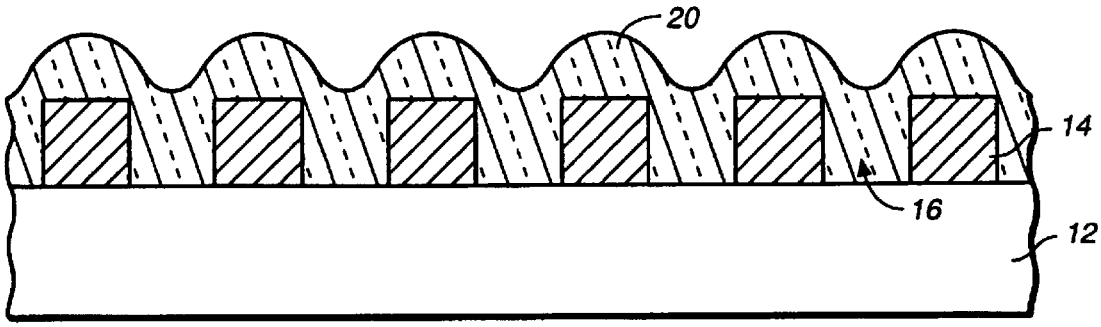
FIGS. 2-4 are cross-sectional views showing the steps of forming a dielectric film on the semiconductor substrate of FIG. 1 in accordance with the method of the present invention.

With reference to FIG. 2, a layer of high ozone undoped silicon dioxide film 20 is deposited on top of the semiconductor substrate 12 and the polysilicon conductors 14. The high ozone undoped silicon dioxide film covers the polysilicon conductors 14 and fills the gasp 16 between the polysilicon conductors 14. The thickness of the first film layer 20 is not less than 100 nm but not greater than 400 nm. The ozone concentration of the first film layer 20 is not less than 120 $g/m^3$ but not greater than 140 $g/m^3$. This first layer of film 20 is not doped with boron or phosphorus so as to give the best possible as deposited gapfill behavior. One feature in the first film layer 20 is the high ozone/TEOS volume ratio of the film. In the prior art, it has been common to use films having a ozone/TEOS ratio of approximately 10 to 10. In the present invention, the ratio of ozone/TEOS is above 15 to 1, and preferably about 17 to 1. The higher ozone/TEOS ratio promotes the formation of dimers, which is a combination of two monomers, which have high surface mobility. The high surface mobility forms a complete surface reaction, not just a gas phase reaction. Because a complete surface reaction is formed, the ions are mobile on the surface and find the location of the least amount of energy. This causes the surface mobility to be high and the film to have a flow-like characteristic. Because the reactants can diffuse readily on the surface, the film fills high aspect ratio gaps between the polysilicon conductors fully and completely without leading any voids or seams.

Figure 3:
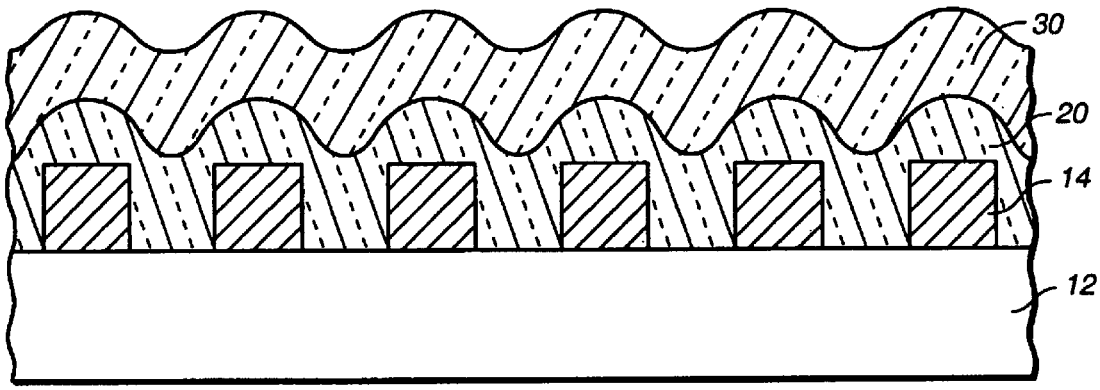

With reference to FIG. 3, a layer of low ozone doped BPSG film 30 is deposited over the silicon dioxide film 20. The thickness of the second film layer 30 is not less than 500 nm. It is important that the BPSG film be thick enough so that after subsequent planarization, there is sufficient thickness of BPSG film over the entire device. An optimum thickness of BPSG film after planarization would be at least 200 nm. Thus, generally the thickness of the dielectric film would be comprised of no more than about 30 percent of the first film layer, undoped silicon dioxide, 20 and at least 70 percent of the second film layer, BPSG film 30. The ozone concentration of the BPSG film 30 is not less than 70 $g/m^3$ but not greater than 100 $g/m^3$. The boron weight percentage in the BPSG film typically ranges from 0 to 4 percent and the phosphorus weight percentage of this film does not exceed 6 percent and typically ranges from 4 to 6 percent. The BPSG film 30 provides the mobile ion gettering function that is required by the semiconductor device.

Then the substrate 12 having the two layers 20 and 30 formed on the top undergoes a heat treatment at a temperature not exceeding 850° C. Ideally, the temperature of the heat treatment would be approximately 700° C. in order to be high enough to provide adequate reflow, but low enough to not affect the device characteristics when the device has a smaller device geometry. As discussed above, since the dielectric film, consisting of the layer of silicon dioxide 20 and the layer of BPSG 30, has good as-deposited gapfill characteristics, the film doe not need to annealed at a high temperature. The annealing is done to densify the film, rather than to soften and flow the film. In the present invention, the annealing is done at a temperature between 700° C. and 800° C. to obtain a sufficiently dense pre-metal dielectric film necessary for manufacturable contact etch profile and etch rate.

Figure 4:
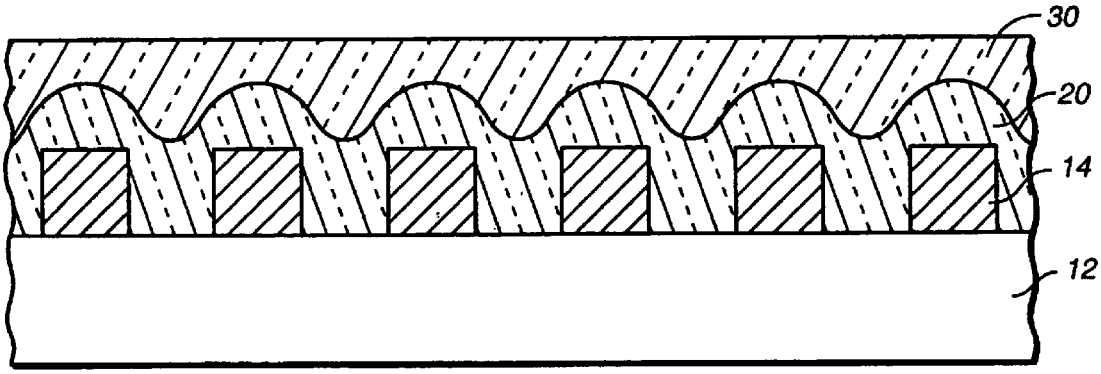
Figure 5:
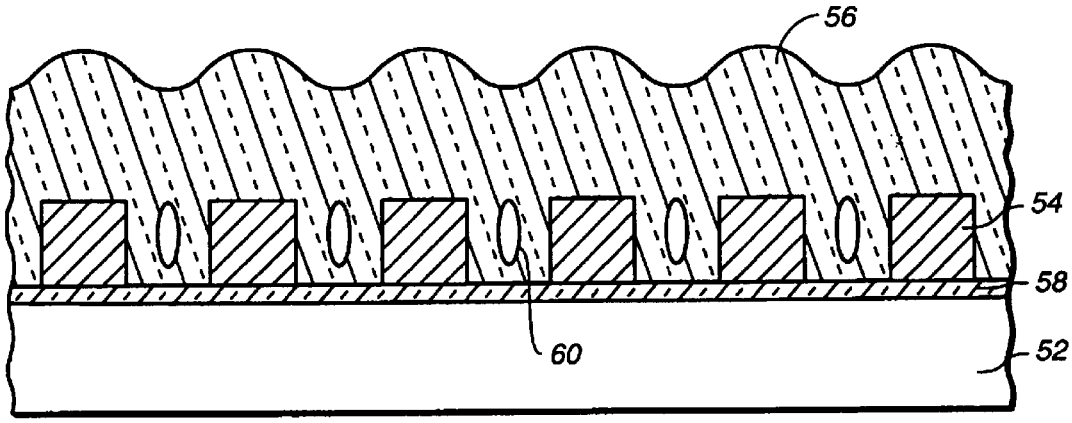
FIG. 5 (PRIOR ART)
FIG. 5 is a cross-sectional view showing a typical dielectric film applied on a semiconductor substrate as is known in the prior art.

With reference to FIG. 4, the top dielectric film layer 30 is planarized using any of the known planarization techniques, including chemical mechanical planarization. As discussed above, the top BPSG layer should be at least 200 nm thick after planarization to allow for adequate mobile-ion gettering. The finished silicon substrate is now ready for the metallization process, in which metal is deposited through the dielectric layer to form metal wiring conductors which interconnect the components formed in the silicon substrate to achieve the desired circuit on the integrated circuit chip. The use of the above-described method of forming a dielectric film layer is not limited to use on semiconductor film layer is not limit to use on semiconductor substrates, but could also be used in forming an insulation layer over two or more polysilicon buses formed on a substrate or in providing an insulating layer in any circumstances in which it is critical for the insulation layer to have good gapfill qualities.

What is claimed is:

1. A method of forming a dielectric film on a semiconductor substrate comprising:

depositing a first layer of undoped ozone and TEOS film on a semiconductor substrate having a plurality of polysilicon conductors on a top surface thereof, the first layer of film having an ozone and TEOS volume ratio that is at least 15 to 1;

depositing a second layer of low ozone doped BPSG film over the first layer of film;

applying a heat treatment to the first and second layers of film; and planarizing the second layer of film such that the second layer is of a thickness of at least 200 nm over the polysilicon conductors.

2. The method of claim 1, wherein the first film layer has a thickness ranging from 100 nm and 400 nm.

3. The method of claim 1, wherein the second film layer has a thickness of at least 500 nm.

4. The method of claim 1, wherein the heat treatment is carried out at a temperature of at least 700° C.

5. The method of claim 1, wherein the second film layer has a boron weight percentage ranging from zero to 4 percent.

6. The method of claim 1, wherein the second film layer has a phosphorous weight percentage not exceeding 6 percent.

7. The method of claim 1, wherein the first film layer has an ozone concentration ranging from 120 $g/m^3$ to 140 $g/m^3$.

8. A method of forming a dielectric film on a semiconductor substrate comprising:

depositing a first layer of undoped ozone and TEOS film on a semiconductor substrate, the first layer of film having a thickness ranging from 100 nm to 400 nm and wherein the ozone and TEOS volume ratio of the first film layer is at least 15 to 1;

depositing a second layer of low ozone doped BPSG film over the first layer of film, the second layer of film having a thickness of at least 500 nm, a boron weight percentage ranging from zero to four percent, and a phosphorous weight percentage ranging from four to six percent;

applying a heat treatment to the first and second layers of film; and planarizing the second layer of film.

9. The method of claim 8, wherein the heat treatment is carried out at a temperature of at least 700° C.

10. The method of claim [9]*8*, wherein the heat treatment is carried out at a temperature of less than 800° C.

11. The method of claim [9]*8* wherein the semiconductor substrate has a plurality of polysilicon conductors on a top surface thereof and wherein the second layer of film is planarized to be of a thickness of at least 200 nm above the polysilicon conductors.

12. A method of forming a semiconductor device, comprising:

forming a diffusion layer and a polysilicon conductor on a silicon substrate surface, depositing a first layer of undoped ozone and TEOS film on the substrate surface, the first layer of film having an ozone/TEOS volume ratio that ranges from at least 15 to 1 to about 17 to 1, and a thickness ranging from 100 nm to 400 nm;

depositing a second layer of low ozone doped BPSG film over the first layer of film, the second film layer having a thickness of at least 500 nm;

planarizing the second layer of film to a thickness of at least 200 nm above the polysilicon conductor;

forming opening through the first and second film layers to expose a portion of each of the diffusion layer and the polysilicon conductor; and forming wiring conductors in the first and second film layers, the wiring conductors being electrically connected through the openings to the diffusion layer and to the polysilicon conductor.

13. The method of claim 12, *further comprising applying a heat treatment to the first and second layers,* wherein the heat treatment is carried out at a temperatures not greater than 850° C.

14. The method of claim 12, wherein the second film layer has a boron weight percentage ranging from zero to 4 percent.

15. The method of claim 12, wherein the second film layer has a phosphorous weight percentage not exceeding 6 percent.

16. The method of claim 12, wherein the first film layer has an ozone concentration ranging from 120 $g/m^3$ to 140 $g/m^3$.

17. A method of forming an insulation layer over a pair of polysilicon buses comprising:

depositing a first layer of undoped ozone and TEOS film on a pair of polysilicon buses, the first layer of film having an ozone and TEOS volume ratio of at least 15 to 1;

depositing a second layer of low ozone doped BPSG film over the first layer of film, the second layer of film having a thickness of at least 500 nm, a boron weight percentage ranging from zero to four percent, and a phosphorous weight percentage not exceeding six percent;

applying a heat treatment to the first and second layers of film; and planarizing the second layer of film such that the thickness of the second layer is at least 200 nm over the pair of polysilicon buses.

* * * * *

UNITED STATES PATENT AND TRADEMARK OFFICE

CERTIFICATE OF CORRECTION

PATENT NO. : RE 40,507 E
APPLICATION NO. : 10/606426
DATED : September 16, 2008
INVENTOR(S) : Kelkar et al.

It is certified that error appears in the above-identified patent and that said Letters Patent is hereby corrected as shown below:

In column 2, line 9, delete “parameter” and insert -- parameters --, therefor.

In column 2, line 10, delete “threshed” and insert -- threshold --, therefor.

In column 2, line 14, delete “is” and insert -- it --, therefor.

In column 3, line 20, delete “best” and insert -- heat --, therefor.

In column 3, line 23, delete “treatment” and insert -- treatments --, therefor.

In column 3, line 62, delete “gasp” and insert -- gaps --, therefor.

In column 4, line 4, delete “10 to 10.” and insert -- 10 to 1. --, therefor.

In column 4, line 15, delete “leading” and insert -- leaving --, therefor.

In column 4, line 44, delete “doe” and insert -- does --, therefor.

In column 4, line 63, delete “limit” and insert -- limited --, therefor.

In column 5, line 17, in Claim 2, delete “and” and insert -- to --, therefor.

In column 6, line 16, in Claim 12, delete “opening” and insert -- openings --, therefor.

UNITED STATES PATENT AND TRADEMARK OFFICE

CERTIFICATE OF CORRECTION

PATENT NO. : RE 40,507 E
APPLICATION NO. : 10/606426
DATED : September 16, 2008
INVENTOR(S) : Kelkar et al.

It is certified that error appears in the above-identified patent and that said Letters Patent is hereby corrected as shown below:

In column 6, line 25, in Claim 13, delete “temperatures” and insert -- temperature --, therefor.

Signed and Sealed this

Sixteenth Day of December, 2008

JON W. DUDAS
*Director of the United States Patent and Trademark Office*